United States Patent
Wang et al.

(10) Patent No.: US 9,347,706 B2
(45) Date of Patent: May 24, 2016

(54) REDUCED PRESSURE DRYING METHOD AND DEVICE OF A SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Song Wang, Beijing (CN); Jiyu Wan, Beijing (CN); He Feng, Beijing (CN); Hongjiang Wu, Beijing (CN)

(73) Assignees: BOE TECHNOLOGY GROUP., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 62 days.

(21) Appl. No.: 14/362,049

(22) PCT Filed: May 23, 2013

(86) PCT No.: PCT/CN2013/076178
§ 371 (c)(1),
(2) Date: May 30, 2014

(87) PCT Pub. No.: WO2014/153827
PCT Pub. Date: Oct. 2, 2014

(65) Prior Publication Data
US 2015/0300736 A1    Oct. 22, 2015

(30) Foreign Application Priority Data

Mar. 28, 2013    (CN) .......................... 2013 1 0103630

(51) Int. Cl.
*F26B 5/04* (2006.01)
*H01L 21/67* (2006.01)
*H01L 21/02* (2006.01)

(52) U.S. Cl.
CPC . *F26B 5/045* (2013.01); *F26B 5/04* (2013.01); *H01L 21/02052* (2013.01); *H01L 21/67034* (2013.01)

(58) Field of Classification Search
CPC ................ F26B 3/00; F26B 3/34; F26B 5/00; F26B 5/04; B03C 3/00; B03C 3/28; C25D 17/02; C25D 21/04
USPC ......... 34/317, 325, 410, 470; 95/57; 204/222, 204/228.1; 118/239, 258
See application file for complete search history.

(56) References Cited

U.S. PATENT DOCUMENTS

| | | | | |
|---|---|---|---|---|
| 4,906,328 A | * | 3/1990 | Freeman | A01B 15/06 427/299 |
| 5,621,982 A | * | 4/1997 | Yamashita | F26B 21/14 34/203 |

(Continued)

FOREIGN PATENT DOCUMENTS

| CN | 101315854 A | 12/2008 |
|---|---|---|
| CN | 202067075 U | 12/2011 |

OTHER PUBLICATIONS

Written Opinion of the International Searching Authority dated Dec. 29, 2013; PCT/CN2013/076178.

(Continued)

*Primary Examiner* — Stephen M Gravini
(74) *Attorney, Agent, or Firm* — Ladas & Parry LLP

(57) ABSTRACT

A reduced pressure drying method and device for a substrate are presented. Firstly, a substrate is placed in a sealed space; then the surface to-be-dried of the substrate is partitioned into a predetermined number of sealed regions; thereafter, the sealed regions are subjected to pressure reduction through gas extraction; finally, the sealed regions are dried through gas insufflation, and then the substrate is taken out from the sealed space. The method can perform reduced pressure drying to various-sized substrates, ensuring uniform pressure and humidity and avoiding formation of reduced pressure drying speckles.

16 Claims, 1 Drawing Sheet

(56) References Cited

U.S. PATENT DOCUMENTS

| | | | | |
|---|---|---|---|---|
| 5,628,121 A * | 5/1997 | Brooks | H01L 21/67393 | 141/93 |
| 5,644,855 A * | 7/1997 | McDermott | F26B 21/14 | 34/218 |
| 5,713,138 A * | 2/1998 | Rudd | F26B 13/14 | 34/124 |
| 5,724,748 A * | 3/1998 | Brooks | B65D 81/20 | 206/213.1 |
| 5,778,554 A * | 7/1998 | Jones | H01L 21/67034 | 34/58 |
| 5,882,168 A * | 3/1999 | Thompson | H01L 21/67173 | 414/416.01 |
| 6,029,371 A * | 2/2000 | Kamikawa | H01L 21/67034 | 34/516 |
| 6,067,727 A * | 5/2000 | Muraoka | H01L 21/68728 | 34/317 |
| 6,802,137 B1 * | 10/2004 | Gray | F26B 21/145 | 34/340 |
| 6,925,731 B2 * | 8/2005 | Nishimura | C23C 16/4405 | 34/406 |
| 6,944,970 B2 * | 9/2005 | Silverbrook | F26B 13/102 | 101/389.1 |
| 7,299,566 B2 * | 11/2007 | Komatsu | H01L 21/67103 | 34/78 |
| 7,353,623 B2 * | 4/2008 | Asuke | F26B 11/18 | 34/381 |
| 7,484,315 B2 * | 2/2009 | Suzuki | C23C 16/16 | 118/726 |
| 7,827,930 B2 * | 11/2010 | Lubomirsky | C23C 18/1628 | 118/319 |
| 7,921,578 B2 * | 4/2011 | McAllister | D06F 35/00 | 134/10 |
| 8,347,525 B2 * | 1/2013 | Gerde | B01D 1/18 | 128/203.15 |
| 8,393,091 B2 * | 3/2013 | Kawamoto | H01L 21/02057 | 134/21 |
| 8,793,896 B2 * | 8/2014 | Patel | F26B 5/06 | 165/185 |
| 8,898,928 B2 * | 12/2014 | Sirard | H01L 21/02057 | 118/728 |
| 2002/0027080 A1 * | 3/2002 | Yoshioka | C25D 17/02 | 205/123 |
| 2004/0045184 A1 * | 3/2004 | Takeshita | H01L 21/67017 | 34/218 |
| 2006/0254419 A1 * | 11/2006 | Leonard | H01G 7/02 | 95/57 |
| 2006/0272174 A1 * | 12/2006 | Hartig | C23C 14/564 | 34/475 |
| 2008/0104861 A1 * | 5/2008 | Yahiro | F26B 13/10 | 34/463 |

OTHER PUBLICATIONS

First Chinese Office Action Dated Jul. 29, 2014; Appln. No. 201310103630.7.

* cited by examiner

REDUCED PRESSURE DRYING METHOD AND DEVICE OF A SUBSTRATE

FIELD OF THE INVENTION

The present invention relates to manufacture of a substrate, in particular to a reduced pressure drying method and device for a substrate.

BACKGROUND OF THE INVENTION

Currently, reduced pressure drying device has two arrangements of vent holes: one is central ventilation arrangement; the other is peripheral ventilation arrangement. However, as to large-sized substrates, both the two arrangements will cause non-uniform ventilation due to a small number of vent holes and distribution thereof. Further, due non-uniform gas flow over a substrate surface caused by poor fluidity of photoresist and humidity difference on the substrate surface, etc., speckles—most commonly crescent-like speckles—will appear after reduced pressure drying. Currently, the speckles after reduced pressure drying can not be effectively controlled, which increases false rate in substrate quality judgement, and is adverse to substrate quality inspection, thus affecting substrate quality and causing inconvenient for subsequent operations.

SUMMARY OF THE INVENTION

(1) Technical Problems to be Solved

The technical problem to be solved by the present invention is to provide a reduced pressure drying method and device for a substrate, in order to solve the problem of speckles produced in an existing reduced pressure drying process.

(2) Technical Solutions

According to an embodiment of the present invention, a reduced pressure drying method for a substrate is provided. The method comprises following steps of:

S1: placing the substrate in a sealed space;
S2: partitioning a surface of the substrate to be dried into a predetermined number of sealed regions;
S3: extracting gas from the sealed regions to reduce pressure;
S4: blowing and drying the sealed regions, and taking out the substrate from the sealed space.

Preferably, the step S3 can comprise:
S31: selecting one of the sealed regions as a first reduced pressure region to perform gas extraction and pressure reduction; and when the pressure of the first reduced pressure region is less than a predetermined pressure value, proceeding to step S32;
S32: if the first reduced pressure region has an adjoining sealed region, then a sealed region formed by communicating the first reduced pressure region with the adjoining sealed region of the first reduced pressure region being taken as the first reduced pressure region, proceeding to step S33; otherwise, if the first reduced pressure region has no adjoining sealed region, then ending the gas extraction;
S33: extracting gas form the current first reduced pressure region so as to reduce pressure, and when the pressure in the current first reduced pressure region is less than the predetermined pressure value, returning to the step S32.

More preferably, in the step S32, after ending the gas extraction, the method further comprises repartitioning the first reduced pressure region into the predetermined number of sealed regions.

Preferably, the step S4 can comprise:
S41: selecting one of the sealed regions as a first drying region to perform blow drying, when a humidity in the first drying region is less than a predetermined humidity value, proceeding to step S42;
S42: if the first drying region has an adjoining sealed region, then a sealed region formed by communicating the first drying region with the adjoining sealed region of the first drying region being taken as the first drying region, and proceeding to step S43; otherwise, if the first drying region has no adjoining sealed region, then ending the drying, and taking our the substrate from the sealed space;
S43: blow drying the current first drying region, and when a humidity in the current first drying region is less than the predetermined humidity value, returning to the step S42.

According to an embodiment of the present invention, a reduced pressure drying device for a substrate by performing the method according the above method, wherein the device comprises:

a drying container formed by a first baffle plate, a second baffle plate, a third baffle plate, a bottom plate, a sealing cover and a control plate, configured to accommodating a substrate to-be-dried, wherein the first baffle plate, the second baffle plate, the third baffle plate, the bottom plate and the control plate constitute a rectangular groove, and the sealing cover is provided on an side opposite to the bottom plate and configured to insulate the drying container from the air outside;

wherein the control plate is configured to control a drying process of the substrate.

Preferably, the control plate is provided with slots at intervals thereon.

Preferably, in the case that the first baffle plate and the control plate are located at two opposite sides of the drying container, the first baffle plate is provided with slots thereon in correspondence with the slots on the control plate.

Preferably, the second baffle plate is provided with slots at intervals thereon.

Preferably, the third baffle plate is provided with slots thereon in correspondence with the slots on the second baffle plate.

Preferably, the device further comprises an isolation baffle plate configured to partition the rectangular groove by utilizing the slots on the first baffle plate and the slots on the control plate or by utilizing the slots on the second baffle plate and the slots on the third baffle plate.

Preferably, the isolation baffle plate is provided with a pressure control valve communicating with both sides of the isolation baffle plate.

Preferably, an exhaust port is provided between the slots on the control plate.

Preferably, a blowing port is provided between the slots on the control plate.

Preferably, a pressure sensor is provided between the slots on the control plate.

Preferably, a humidity sensor is provided between the slots on the control plate.

Preferably, the control plate is provided thereon with a control panel for monitoring a vacuum-chamber-drying process.

Preferably, an air pump is provided within the control plate, with one end of the air pump being connected to the control panel and the other end of the air pump being connected to the exhaust port and the blowing port.

(3) Beneficial Effect

According to various embodiments of the present invention, one or more of the following advantages can be achieved:

1. A large-sized substrate is partitioned into small sealed regions to be subjected to reduced pressure drying, thus reducing difficulty of a reduced pressure drying process and being easy to implement;

2. The sealed regions are one by one subjected to pressure reduction/drying, which maximumly ensures uniformity of pressure and humidity, thus avoiding formation of reduced pressure drying speckles;

3. The drying container can be adjusted, according to the shape of the substrate, through the rectangular groove constituted by the first baffle plate, the second baffle plate, the third baffle plate, the bottom plate and the control plate, so that reduced pressure drying can be performed for various-sized substrates;

4. The first baffle plate, the second baffle plate, the third baffle plate and the control plate are correspondingly provided with slots for mounting isolation baffle plates thereon, so as to facilitate control of the sizes of sealed regions;

5. Adjoining sealed regions are controlled by the simple-provided pressure control valve to communicate with each other, so that the structure is simple and effective, and the processes is easy to be controlled;

6. The exhaust port and the blowing port can be realized by one port, thus reducing costs and saving control procedures;

7. A pressure sensor and a humidity sensor are provided between the slots on the control plate, thus realizing real-time monitor of the pressure value and the humidity value in a sealed region;

8. The method and the device of the present invention are not only applicable to perform reduced pressure drying for a substrate, but also applicable to any other device comprising a flat surface to be dried under reduced pressure.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In order to solve the problem of speckles produced in a conventional reduced pressure drying process, the present invention provides a reduced pressure drying method and device for a substrate.

Figure 1:
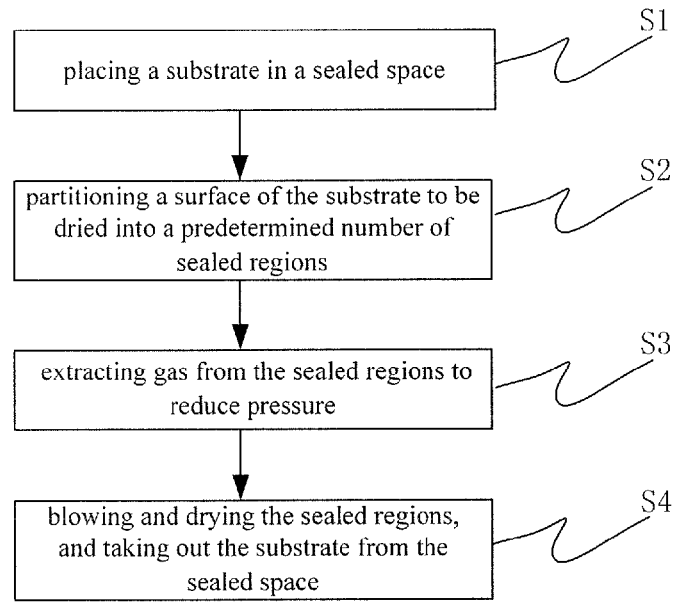
FIG. 1 is a flowchart of a reduced pressure drying method for a substrate according to an embodiment of the present invention.

The flowchart of the method of the present invention is as shown in FIG. 1; In particular, with reference FIG. 1, the method comprises the following steps:

S1: a substrate is placed in a sealed space;

S2: the surface to-be-dried of the substrate is partitioned into a predetermined number of sequentially-adjoining sealed regions.

The term "sequentially-adjoining" means to that the substrate is partitioned into sealed regions with simple geometric shapes from left to right or from top to bottom, etc., according to the actual shape of the substrate so as to perform reduced pressure drying. The term "predetermined number" means to the number of sealed regions that the surface to be dried under reduced pressure of the substrate is partitioned into according to the actual size of the substrate.

S3: the gas in the sealed regions is extracted so as to reduce pressure. S3 may comprise following steps of:

S31: one of the sealed regions is selected as a first reduced pressure region so as to perform gas extraction and pressure reduction; when the pressure in the first reduced pressure region is less than a predetermined pressure value, proceed to step S32.

S32: if the first reduced pressure region has an adjoining sealed region, then a region formed by communicating the first reduced pressure region with the adjoining sealed region of the first reduced pressure region is taken as a first reduced pressure region, and proceeds to step S33; otherwise, if the first reduced pressure region has no adjoining sealed region, which indicates that the whole substrate has been subjected to pressure reduction, the gas extraction ends, and the first reduced pressure region is repartitioned into the predetermined number of sealed regions. During repartition of the sealed region, the current first reduced pressure region can be restored to the predetermined number of sealed regions before the gas extraction and the pressure reduction.

S33: the gas in the current first reduced pressure region is extracted so as to reduce pressure, and when the pressure in the first reduced pressure region is less than the predetermined pressure value, return to step S32. When proceeding to step S33, the pressure in the first reduced pressure region formed after communication will rise and then gradually decrease. Therefore, uniformity of the pressure and humidity is maximally ensured, avoiding formation of reduced pressure drying speckles.

S4: the sealed regions are blow dried, and then the substrate is taken out from the sealed space. The step S4 may further comprise following steps:

S41: one of the sealed regions is selected as a first drying region so as to perform blow drying; and when the humidity in the first drying region is less than a predetermined humidity value, proceed to step S42.

S42: if the first drying region has an adjoining sealed region, then a region formed by communicating the first drying region with the adjoining sealed region of the first drying region is taken as the first drying region, and proceed to step S43; otherwise, if the first drying region has no adjoining sealed region, which indicates that the whole substrate has been subjected to drying, the drying ends, and the substrate is taken out from the sealed space.

S43: the current first drying region is blow dried; and when the humidity in the first drying region is less than the predetermined humidity value, returns to step S42. When proceeding to step S43, the humidity in the first reduced pressure region formed after communication will rise and then gradually decrease.

Figure 2:
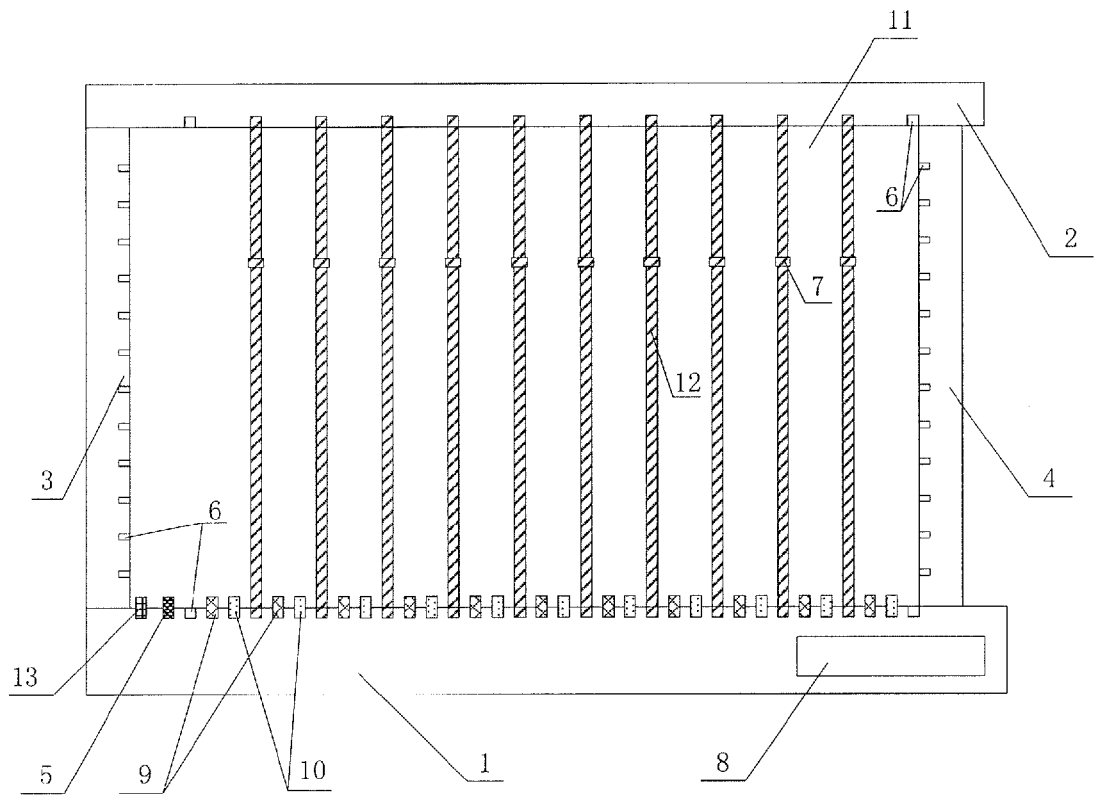
FIG. 2 is a schematic structural diagram of a reduced pressure drying device for a substrate according to an embodiment of the present invention.

According to an embodiment of the present invention, a device for implementing the above-described method is further provided. As shown in FIG. 2, the device comprises:

a drying container formed by a control plate 1, a first baffle plate 2, a second baffle plate 3, a third baffle plate 4, a bottom plate 11 and a sealing cover (not shown), and configured to accommodate a substrate to-be-dried, wherein the first baffle plate 2, the second baffle plate 3, the third baffle plate 4, the bottom plate 11 and the control plate 1 constitute a rectangular groove, and the sealing cover is provided on an side opposite to the bottom plate 11 and configured to insulate the drying container from the air outside;

wherein the control plate 1 is configured to control a drying process of the substrate.

The first baffle plate 2, the second baffle plate 3 and the third baffle plate 4 are adjustable in their positions within the drying container, so as to fit the shape of the substrate.

In the example shown in FIG. 2, the control plate 1 and the first baffle plate 2 are located at two opposite sides of the drying container, and the second baffle plate 3 and the third baffle plate 4 are located at two opposite sides of the drying container.

As shown in FIG. 2, the control plate 1 and the first baffle plate 2 are correspondingly provided with slots 6 at intervals. The word "correspondence" means to that the slots on the control plate 1 are formed to parallel to the slots on the first baffle plate 2; the number of slots on the control plate 1 is identical with that on the first baffle plate 2; and the interval between the slots on the control plate 1 is identical with that on the first baffle plate 2.

The second baffle plate 3 can be provided with slots 6 thereon. The third baffle plate 4 can also be provided with slots 6 in correspondence with the slots on the second baffle plate 3. The second baffle plate 3 and the third baffle plate 4 have a same correspondence relationship therebetween as that between the control plate 1 and the first baffle plate 2.

The device further comprises an isolation baffle plate 12 configured to partition the rectangular groove by utilizing the slots 6 on the first baffle plate 2 and the slots 6 on the control plate 1 or by utilizing the slots 6 on the second baffle plate 3 and the slots 6 on the third baffle plate 4, so as to form suitable-sized regions for drying. In this way, a large-sized substrate is partitioned into small sealed regions to perform reduced pressure drying, which reduces difficulty of a reduced pressure drying process and is easy to implement.

The isolation baffle plate 12 is provided with a pressure control valve 7 configured to communicate with both sides of the isolation baffle plate; when the pressure control valve 7 opens, it can communicate with the sealed regions at both sides of the isolation baffle plate 12. The pressure value of the pressure control valve 7 is controllable, and can be adjusted automatically or manually.

There are provided an exhaust port 13 and a blowing port 5 between the slots 6 on the control plate 1. The blowing port 13 and the exhaust port 5 may be realized by one port.

There are provided a pressure sensor 9 and a humidity sensor 10 between the slots 6 on the control plate 1. The pressure sensor 9 and the humidity sensor 10 can be provided at each interval or some interval between the slots 6 on the control plate 1.

The control plate 1 is provided with a control panel 8 for monitoring a reduced pressure drying process.

An air pump (not shown) is provided within the control plate 1, with one end of the air pump being connected to the control panel 8 and the other end of the air pump being connected to the exhaust port 13 and the blowing port 5. When pressure reduction through gas extraction is performed, the blowing port 5 is closed, and the exhaust port 13 communicates with the air pump to extract gas from the inside of the substrate to outside; when blow drying is performed, the exhaust port 13 is closed and the blowing port 5 communicates with the air pump so as to blowing gas from the outside of the substrate to inside. The control plate 1 is connected with an external power supply.

A particular operation of the above-described device according to the embodiment of the present invention is given as follows:

Firstly, the sealing cover is opened, and a substrate is placed on the bottom plate of the drying container, such that the surface to be dried under reduced pressure faces to the sealing cover, and that an edge of the substrate is close to the control plate. The first baffle plate, the second baffle plate and the third baffle plate are adjusted in their positions and sizes, so that the first baffle plate, the second baffle plate, the third baffle plate, the bottom plate and the control plate are in close contact (airtight connection formed between each two adjacent components) after adjustment. Thus, the device can adapt to various-shaped substrates, and can perform a reduced pressure drying to various-sized substrates. Then, the substrate is partitioned into several sealed regions by utilizing the isolation baffle plates according to requirements, (the isolation baffle plates are mounted in the slots on both the control plate and the first baffle plate, or in the slots on both the second baffle plate and the third baffle plate), and the parameters of the pressure control valves on the isolation baffle plates are regulated. Finally, the sealing cover is added. Here, a sealed space is formed by the sealing cover, the first baffle plate, the second baffle plate, the third baffle plate, the bottom plate and the control plate. The isolation baffle plates further partition the sealed space into small sealed regions. In this way, a large-sized substrate is partitioned into small sealed regions to be dried under reduce pressure, which reduces difficulty of the reduced pressure drying process and is easy to implement.

Next, the sealed regions are subjected to pressure reduction through gas extraction. Typically, an outermost sealed region of the drying container is selected as a first reduced pressure region so as to be subjected to pressure reduction through gas extraction. If an intermediate sealed region is selected to start pressure reduction, then the exhaust port and the blowing port are required to move to the corresponding sealed region. In the case that an outermost sealed region is selected as a first reduced pressure region for pressure reduction through gas extraction, the control panel on the control plate performs gas extraction to the first reduced pressure region, by utilizing the air pump within the control plate and the exhaust port; when it is detected by the pressure sensor within the first reduced pressure region that the pressure value in the first reduced pressure region is less than a predetermined pressure threshold value, the pressure control valve on the isolation baffle plate between the first reduced pressure region and an adjoining sealed region of the first reduced pressure region is controlled to open, so that the first reduced pressure region and the adjoining sealed region form a communicated region to proceed with the pressure reduction through gas extraction, and at this moment, the pressure value in the first reduced pressure region will rise, and the pressure value in the adjoining sealed region of the first reduced pressure region will decrease, and ultimately, the pressure values in the two regions will be equal and simultaneously decrease. As the pressure value detected by the pressure sensor is less than the predetermined pressure threshold value, then the pressure control valve is controlled to open a next adjoining sealed region, and so forth, so that all sealed regions are communicated and subjected to pressure reduction through gas extraction. This maximumly ensures uniformity of pressure and humidity, thereby avoiding formation of reduced pressure drying speckles. Adjoining sealed regions are controlled to communicate by the pressure control valve which is simple in structure, thus leading to a simple and effective structure and an easy controlled process. The pressure sensor and the humidity sensor can realize a real-time monitoring of the pressure value and the humidity value in the sealed regions.

After completion of pressure reduction through gas extraction, it is required to close the pressure control valves on the isolation baffle plates between respective sealed regions, so as to reconstitute sealed regions and thereafter to perform drying process through gas insufflation.

The drying process through gas insufflation is similar to the pressure-reduction process through gas extraction, and the description thereof is omitted.

In the method and the device according to the embodiments of the present invention, a large-sized substrate is dried under reduced pressure in a stage by stage way, and uniform gas extraction is realized within smaller regions at each of the stages. The changing in implementation mode of a reduced pressure drying avoids requirements for high-quality photoresist, and reduces material costs, meanwhile, the mode meets tact time of a single product, thus greatly reducing formation of reduced pressure drying speckles and improving product quality.

The above embodiments are only intended to explain but not to limit the present invention. A variety of modifications and variations can be made by the ordinary skilled in the related art, without departing from the spirit and the scope of the present invention; therefore, all equivalent technical solutions should be within the scope of present invention, and the scope of the present invention is defined by the claims.

The invention claimed is:
1. A reduced pressure drying method for a substrate, wherein the method comprises following steps of:
S1: placing the substrate in a sealed space;
S2: partitioning the sealed space into at least two sealed regions, on a surface of the substrate to-be-dried;
S3: extracting gas from the sealed regions to reduce pressure;
S4: blowing and drying the sealed regions, and taking out the substrate from the sealed space.
2. The method according to claim 1, wherein the step S3 comprises:
S31: selecting one of the sealed regions as a first reduced pressure region to perform gas extraction and pressure reduction; and when the pressure of the first reduced pressure region is less than a predetermined pressure value, proceeding to step S32;
S32: if the first reduced pressure region has an adjoining sealed region, then a sealed region formed by communicating the first reduced pressure region with the adjoining sealed region of the first reduced pressure region being taken as the first reduced pressure region, proceeding to step S33; otherwise, if the first reduced pressure region has no adjoining sealed region, then ending the gas extraction;
S33: extracting gas form the current first reduced pressure region so as to reduce pressure, and when the pressure in the current first reduced pressure region is less than the predetermined pressure value, returning to the step 332.
3. The method according to claim 2, wherein in the step S32, after ending the gas extraction, the method further comprises repartitioning the first reduced pressure region into the at least two sealed regions.
4. The method according to claim 3, wherein the step S4 comprises steps of:
S41: selecting one of the sealed regions as a first drying region to perform blow drying, when a humidity in the first drying region is less than a predetermined humidity value, proceeding to step 342;
S42: if the first drying region has an adjoining sealed region, then a sealed region formed by communicating the first drying region with the adjoining sealed region of the first drying region being taken as the first drying region, and proceeding to step S43;
otherwise, if the first drying region has no adjoining sealed region, then ending the drying, and taking out the substrate from the sealed space;
S43: blow drying the current first drying region, and when a humidity in the current first drying region is less than the predetermined humidity value, returning to the step S42.
5. A reduced pressure drying device for a substrate by performing the method according to claim 1, wherein the device comprises:
a drying container with a sealed space formed by a first baffle plate, a second baffle plate, a third baffle plate, a bottom plate, a sealing cover and a control plate, configured to accommodating a substrate to-be-dried, wherein the first baffle plate is opposite to the control plate, the sealing cover is opposite the bottom plate;
wherein the control plate is configured to control a drying process of the substrate, one or more slots are formed on a surface of the control plate, and one or more slots are formed on a surface of the first baffle plate facing the surface of the control plate,
the device further comprises one or more isolation baffle plates configured to be inserted into the one or more slots on the first baffle plate and the control plate, and the one or more fallen baffle plates partition the sealed space into at least two sealed regions on a surface of the substrate to-be-dried.
6. The device according to claim 5, wherein one or more slots are formed on a surface of the second baffle plate.
7. The device according to claim 6, wherein one or more slots are formed on a surface of the third baffle plate, in correspondence with the slots on the second baffle plate.
8. The device according to claim 5, wherein the isolation baffle plate is provided with a pressure control valve communicating with both sides of the isolation baffle plate.
9. The device according to claim 5, wherein an exhaust port is provided on the control plate.
10. The device according to claim 5, wherein a blowing port is provided on the control plate.
11. The device according to claim 5, wherein a pressure sensor is provided on the control plate.
12. The device according to claim 5, wherein a humidity sensor is provided on the control plate.
13. The device according to claim 5, wherein the control plate is provided thereon with a control panel for monitoring a vacuum-chamber-drying process.
14. The device according to claim 13, wherein an air pump is provided within the control plate, with one end of the air pump being connected to the control panel and the other end of the air pump being connected to the exhaust port and the blowing port.

15. The device according to claim 11, wherein in a case that at least two of the slots are formed on a surface of the control plate, the pressure sensor is provided between two adjacent slots on the control plate.

16. The device according to claim 12, wherein in a case that at least two of the slots are formed on a surface of the control plate, the humidity sensor is provided between two adjacent slots on the control plate.

* * * * *